United States Patent [19]
Dresser

[11] Patent Number: 5,418,924
[45] Date of Patent: May 23, 1995

[54] MEMORY CONTROLLER WITH PROGRAMMABLE TIMING

[75] Inventor: Scott A. Dresser, Hudson, Mass.

[73] Assignee: Hewlett-Packard Company, Palo Alto, Calif.

[21] Appl. No.: 938,901

[22] Filed: Aug. 31, 1992

[51] Int. Cl.[6] .............................................. G06F 9/26
[52] U.S. Cl. ........................ 391/425; 364/DIG. 1; 364/270.2; 395/550
[58] Field of Search ... 364/200 MS File, 900 MS File; 395/400, 425, 550

[56] References Cited

U.S. PATENT DOCUMENTS

| | | | |
|---|---|---|---|
| 4,755,964 | 7/1988 | Miner | 395/425 |
| 5,097,437 | 3/1992 | Larson | 395/775 |
| 5,276,856 | 1/1994 | Norsworthy et al. | 395/550 |

Primary Examiner—Rebecca L. Rudolph
Assistant Examiner—Hiep T. Nguyen

[57] ABSTRACT

A memory controller for controlling access to a memory includes a circuit for generating memory signals, including address and control signals, for accessing a memory in response to a physical address, and a circuit for programming the timing of the memory signals in response to predetermined timing control information which defines the timing requirements of the memory. The circuit for programming the timing of the memory preferably includes a register for storing timing control bits and selectors responsive to the timing control bits for selecting timing control parameters from a group of predetermined timing control parameters. The circuit for programming the timing preferably further includes a circuit responsive to each timing control parameter and to a selected memory signal for generating a timing control signal. The timing control signal controls the timing of one of the memory signals. The timing parameters can specify the duration of a memory signal or the time delay between a predefined event in one memory signal and a predefined event in another memory signal. The programmable feature permits the memory controller to be utilized with memories having different timing requirements.

7 Claims, 9 Drawing Sheets

MEMORY CONTROLLER WITH PROGRAMMABLE TIMING

FIELD OF THE INVENTION

The present invention relates generally to data processing systems and, more particularly, to a memory controller with programmable control signal timing.

DESCRIPTION OF THE PRIOR ART

In a typical computer system, a central processor is coupled through a memory controller to main memory. The memory controller receives a physical address from the central processor and converts the address to a form that is compatible with the devices in the memory. In addition, the memory controller provides control signals for the memory. Typical dynamic random access memories (DRAMs) utilize a multiplexed addressing scheme wherein row addresses and column addresses are sequentially strobed into each memory device. The memory controller provides control signals for multiplexed operation. The signals supplied to the memory devices must meet strict timing requirements for proper operation.

Memory controller integrated circuits (ICs) are frequently custom designed to operate with a particular type of memory device. Unfortunately, the cost of developing such memory controller ICs is extremely high. Since the timing of memory signals provided by the memory controller IC is fixed, such customized memory controller ICs may only be used with the memory devices for which they were designed or with memory devices having identical timing requirements. Thus, the choices available to the memory designer were to use existing memory systems in new system designs, or to develop new custom memory controller IC's at high cost. It is thus desirable to provide a memory controller having sufficient flexibility to be usable with memory devices having different timing requirements.

Another limitation with conventional memory controller ICs is that the timing cannot be changed, even using the same DRAM chips. Hence, it is impossible to increase the speed of the memory signals.

SUMMARY OF THE INVENTION

In accordance with the present invention, a memory controller for controlling access to a memory comprises means for generating memory signals, including address and control signals, for accessing the memory in response to a physical address and means for programming the timing of the memory signals in response to predetermined timing control information which defines the timing requirements of the memory.

The means for programming preferably comprises means for storing one or more timing control bits and selector means responsive to the timing control bits for selecting timing control parameters from a group of predetermined timing control parameters. The means for programming preferably further includes means responsive to the timing control parameters and to selected memory signals for generating timing control signals. The timing control signals control the timing of the memory signals. The means for generating timing control signals preferably comprises means for determining the elapsed time after a predefined event in the selected memory signal and means for generating the timing control signal when the elapsed time after the predefined event is equal to the timing control parameter.

In accordance with the invention, memory signals such as row address strobes, column address strobes, row addresses and column addresses have programmable timing. In addition, the latch control for read data (which is an internal signal of the memory controller) has programmable timing. The programmable feature of the memory controller permits the memory controller to be used with memories having different timing requirements and may be used to adjust the timing at the memory interface. The timing control bits are preferably loaded into a control register in the memory controller during initialization of the system. The timing control parameters derived from the timing control bits specify timing in multiples of the system clock cycle.

BRIEF DESCRIPTION OF THE DRAWINGS

A preferred embodiment of the present invention will now be described with reference to the drawings in which.

DETAILED DESCRIPTION OF A PREFERRED EMBODIMENT

In accordance with the present invention, a memory controller provides address and control signals with programmable timing. The memory controller of the present invention may be used in systems having different clock frequencies and memory timing requirements.

Figure 1:
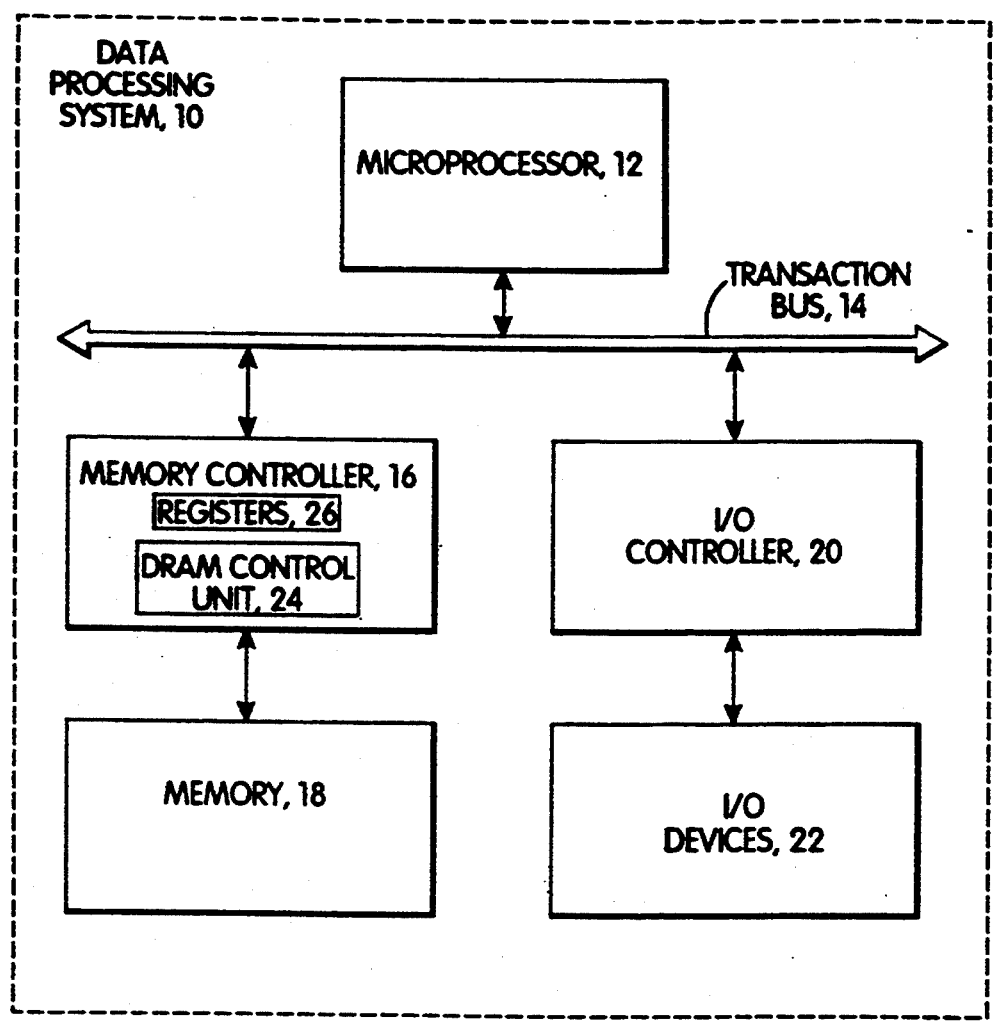
FIG. 1 is a block diagram of a data processing system that is unsuitable for implementing the preferred embodiment of the present invention.

FIG. 1 is a block diagram of a data processing system 10 that is suitable for implementing the present invention. The data processing system 10 includes a microprocessor 12, which directs the activities of the data processing system. The microprocessor 12 is coupled to a transaction bus 14 through which it communicates with other components of the data processing system 10. The data processing system 10 further comprises a memory subsystem including a memory controller 16 and a memory 18. The memory controller 16 is connected to the transaction bus 14 and controls access to memory 18. The memory 18 is a dynamic random access memory having multiplexed address lines. The memory controller includes registers 26 that hold status and control information and a dynamic random access memory (DRAM) control unit 24 that interfaces directly with DRAM chips in memory 18. The data processing system 10 additionally comprises an input/output (I/O) subsystem including an I/O controller 20 and I/O devices 22. The I/O controller 20 is coupled to transaction bus 14 to control access to the I/O devices 22.

Figure 2:
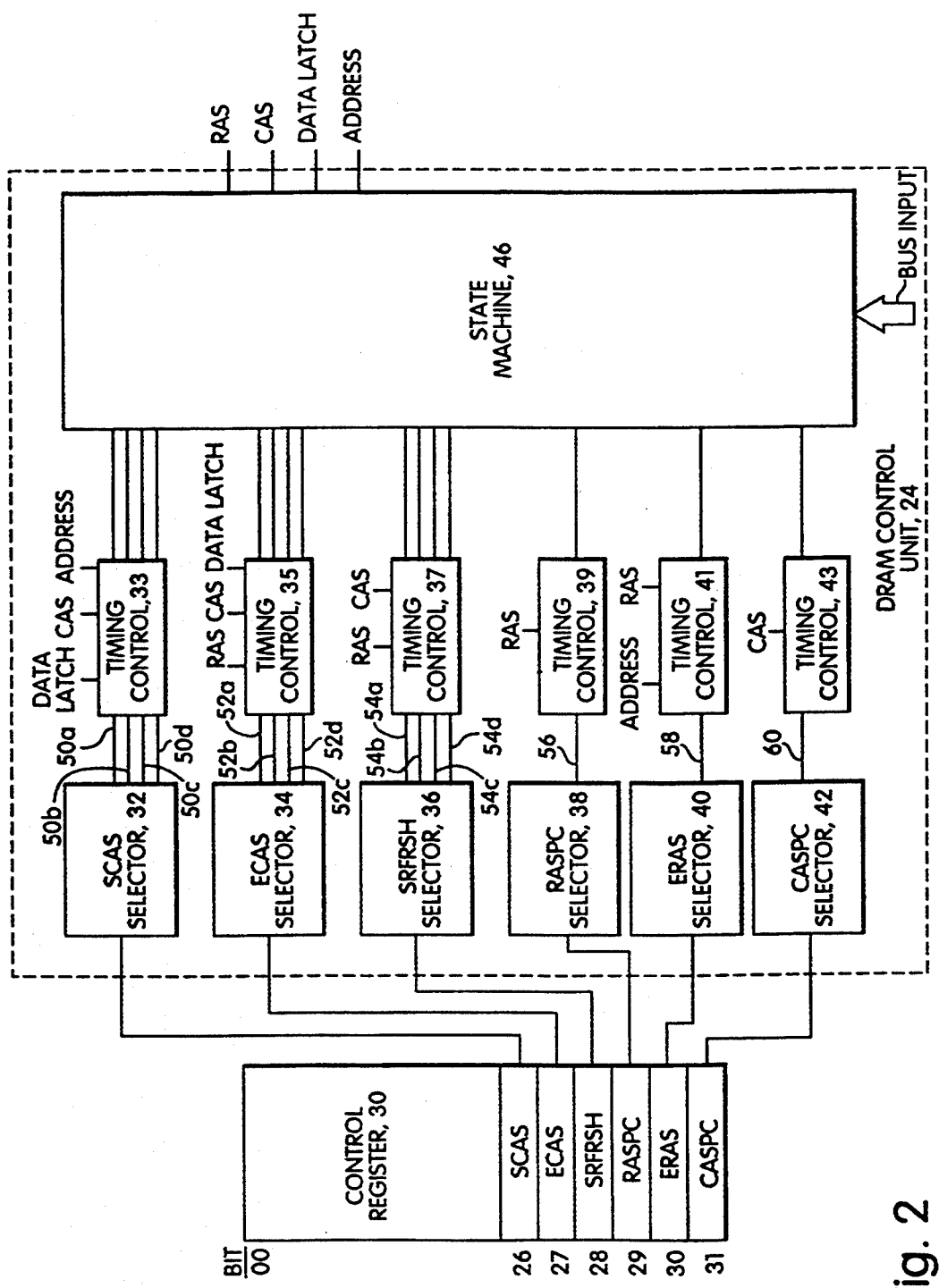
FIG. 2 is a block diagram of a portion of the memory controller 16 of FIG. 2.

FIG. 2 is a block diagram of a portion of the memory controller 16 (FIG. 1). Specifically, FIG. 2 shows a control register 30 of the registers 26 (FIG. 1) and the DRAM control unit 24 (FIG. 2). The control register 30 and the DRAM control unit 24 determine the timing of the address and control signals that are provided to the memory 18. The control register 30 holds control bits that are used in configuring the memory subsystem. The control register 30 holds 32 bits in total, but only bits 26–31 are of particular relevance to the present invention. Bit 26 is the short column address strobe (SCAS) bit; bit 27 is the early column address strobe (ECAS) bit; bit 28 is the stretch refresh cycle (SRFRSH) bit; bit 29 is the row address strobe precharge (RASPC) bit; bit 30 is the early row address strobe (ERAS) bit; and bit 31 is the column address strobe precharge (CASPC) bit. The significance of these bits is discussed in detail below. The control register 30 is initialized when the system is powered up, using information taken from a read only memory (not shown).

The DRAM control unit 24 includes selectors 32, 34, 36, 38, 40 and 42 that select timing parameters for the memory address and control signals based on the values of timing control bits 26–31 contained in the control register 30. A separate selector is provided for each of the timing control bits. The selectors include an SCAS selector 32, which uses the SCAS bit from control register 30 as a selection bit to produce four timing parameters on lines 50a, 50b, 50c and 50d. The ECAS selector 34 uses the ECAS bit from control register 30 as a selection bit to produce timing parameters on lines 52a, 52b, 52c and 52d. Similarly, the SRFRSH selector 36 uses the SRFRSH bit from control register 30 as a selection bit to produce timing parameters on lines 54a, 54b, 54c and 54d. The RASPC selector 38, the ERAS selector 40 and the CASPC selector 42 use the RASPC bit, the ERAS bit and the CASPC bit, respectively, from control register 30 as selection bits to produce timing parameters on respective lines 56, 58 and 60.

The timing parameters on lines 50a–50d, 52a–52d, 54a–54d, 56, 58 and 60 are input to timing control units 33, 35, 37, 39, 41 and 43, respectively. The timing control units convert the timing parameters to timing control signals which control the timing of the address and control signals that are supplied to memory 18. The operation of the timing control units is described below. The timing control units 33, 35, 37, 39, 41 and 43 provide the timing control signals to a state machine 46. The state machine 46 also receives inputs on transaction bus 14 and provides address and control signals to memory 18. In general, the state machine 46 is structured and operates in a manner that is similar to conventional memory controllers except that it receives programmable timing control signals as described herein. As a result, the address and control signals supplied to memory 18 have programmable timing. The output signals to memory 18 include a row address strobe (RAS), a column address strobe (CAS), row address, column address and write data. The internal read data latch signal, which latches data read from the memory 18 into the memory controller, also has programmable timing.

In general, the components of FIG. 2 operate as follows. Each of the bits 26–31 of control register 30 may assume a value of "0" or "1". The values assumed by bits 26–31 of the control register 30 are input to respective selectors 32, 34, 36, 38, 40 and 42 to select appropriate timing parameters. The timing parameters are then input to the respective timing control units 33, 35, 37, 39, 41 and 43. The timing control units use the timing parameters and a selected one of the memory signals to generate a timing control signal. The timing control signal causes one of the memory signals, such as CAS, RAS or data latch, to be asserted or deasserted as described below. The state machine 46 generates the signals to control memory 18 in accordance with the timing control signals and the information received on bus 14. By selection of the values of the timing control bits that are loaded into bit positions 26–31 of control register 30, the timing of the memory controller is programmed. In each case, the timing is programmed in multiples of the system clock cycle.

Figure 3A:
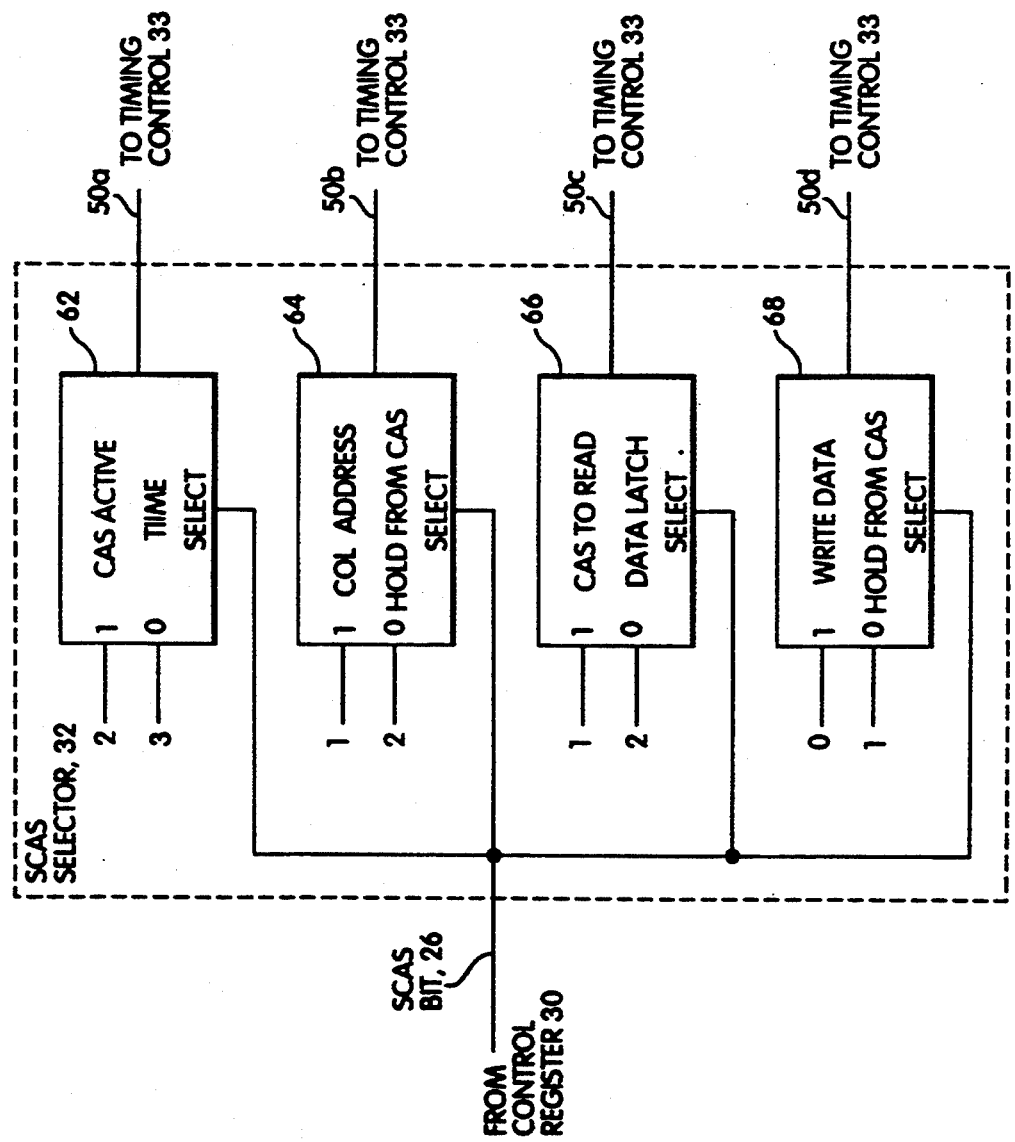
FIG. 3a is a more detailed block diagram of the SCAS selector 32 of FIG. 1.

FIG. 3a shows the SCAS selector 32 in more detail. The SCAS selector 32 includes four multiplexers 62, 64, 66 and 68. Each of the multiplexers 62, 64, 66 and 68 has two inputs. One of the inputs is selected when the select input to the multiplexer is "1" (see labels in FIG. 3a), and the other input is selected when the select input is "0" (see labels "0" in FIG. 3a).

Multiplexer 62 selects the CAS active time to be either two or three clock cycles. If the SCAS bit is "1", the CAS active time is selected to be two cycles. If the SCAS bit is "0", the CAS active time is selected to be three cycles. The timing parameter (e.g. 2 cycles or 3cycles) that is selected by multiplexer 62 is output on line 50a to the timing control unit 33 (FIG. 2).

Multiplexer 64 determines how long the column address is held after the assertion of the CAS signal. When the SCAS bit is "1", the column address is held for one cycle. When the SCAS is "0", the column address is held for two cycles. The selected timing parameter is output on line 50b to timing control unit 33 (FIG. 2).

Multiplexer 66 controls the time between the initial assertion of the CAS signal and each assertion of the read data latch signal. When the SCAS bit is "1", one cycle separates the CAS signal and the read data latch signal. When the SCAS bit is "0", two cycles separate the CAS signal and the read data latch signal. The selected timing parameter is output on line 50c to the timing control unit 33.

Multiplexer 68 controls how long write data is held after the assertion of the CAS signal. If the SCAS bit is "1", the write data is held for zero cycles, and if the SCAS bit is "0" the write data is held for one cycle. The selected timing parameter is output on line 50d to timing control unit 33 (FIG. 2).

Figure 3B:
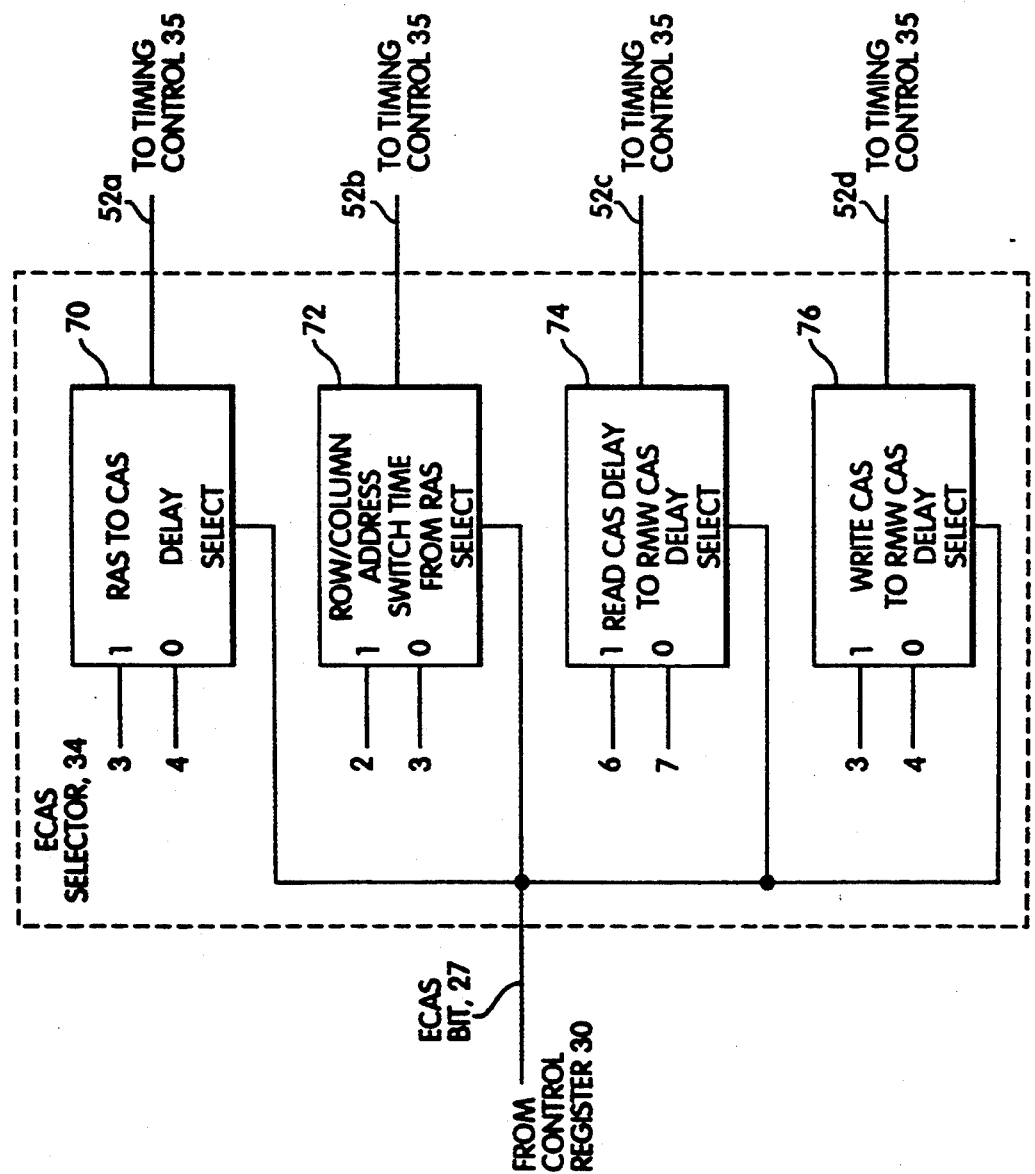
FIG. 3b is a more detailed block diagram of the ECAS selector 34 of FIG. 22.

FIG. 3b shows the ECAS selector 34 in more detail. The ECAS selector 34 includes four multiplexers 70, 72, 74 and 76. The ECAS bit in control register 30 (FIG. 2) is the select input to each of the multiplexers 70, 72, 4 and 76 (FIG. 3b). Multiplexer 70 selects the delay between the assertion of the RAS signal and the assertion of the CAS signal. If the ECAS bit is "1", the delay is three cycles, and if the ECAS 27 is "0" the delay is four cycles. The selected delay is output on line 52a to timing control unit 35 (FIG. 2).

Multiplexer 72 (FIG. 3b) selects the number of cycles that separate the assertion of the RAS signal and the switching of the address lines from a row address to a column address. If the ECAS bit is "1", two cycles separate the assertion of the RAS signal and the switching of the address lines from a row address to a column address. If the ECAS bit is "0", three cycles separate these events. The selected number of cycles is output on line 52b to the timing control unit 35 (FIG. 2).

Multiplexer 74 (FIG. 3b) selects the separation between the assertion of the CAS signal during a read cycle and the assertion of the CAS signal in a read modify write cycle. If the ECAS bit is "1", the delay is six cycles, and if the ECAS bit is "0", the delay is seven cycles. The selected number of cycles is output over line 52c to timing control unit 35 (FIG. 2).

Multiplexer 76 (FIG. 3b) is used to select the delay between the assertion of the CAS signal in a write cycle and the assertion of the CAS signal in a read modify write cycle. The delay may be either three cycles or four cycles. The multiplexer 76 selects the delay as three cycles when the ECAS bit has a value of "1", and selects the delay as four cycles when bit has a value of "0". The selected delay is output on line 52d to timing control unit 35 (FIG. 2).

Figure 3C:
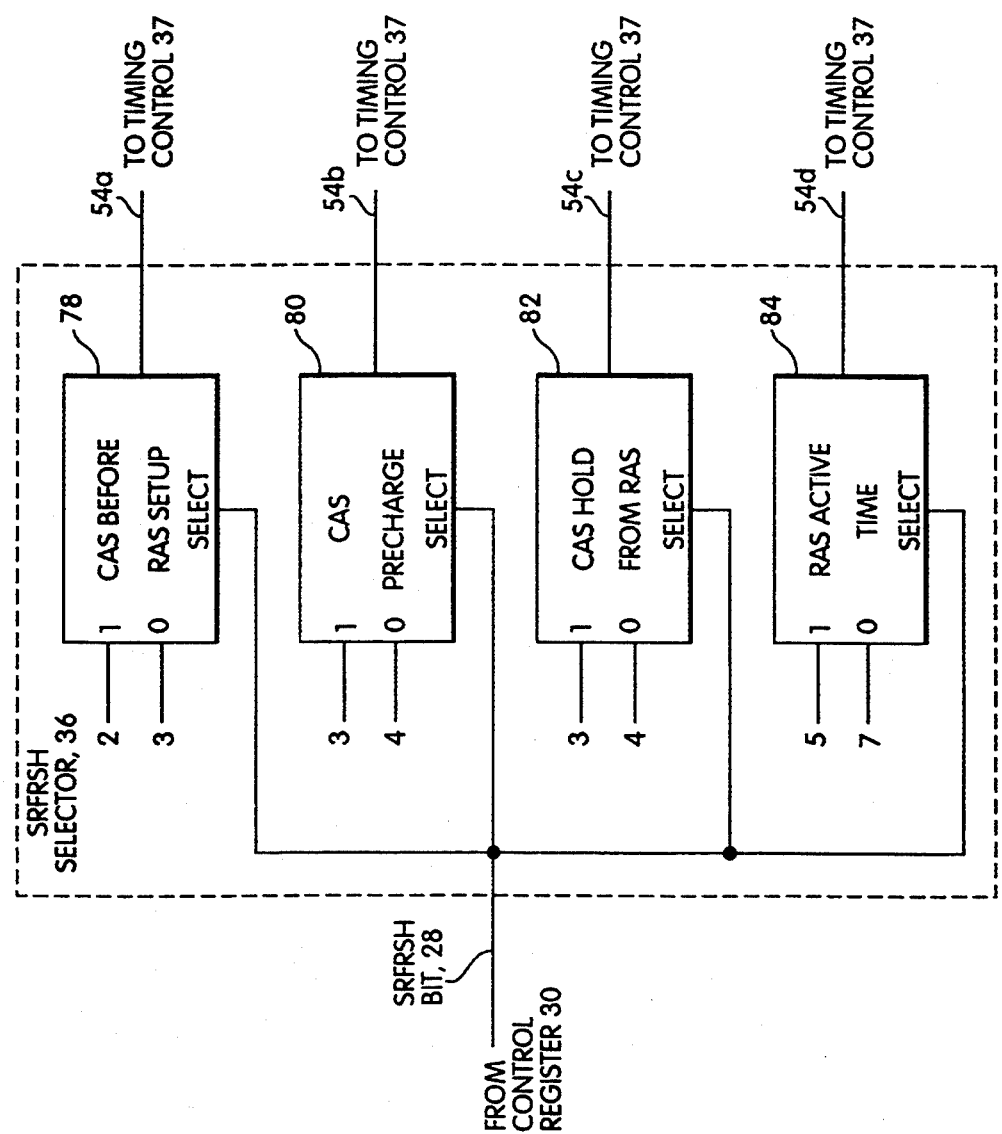
FIG. 3c is a more detailed block diagram of the SRFRSH selector 36 of FIG. 2.

FIG. 3c shows the SRFRSH selector 36 in more detail. The SRFRSH selector 36 is used to select timing parameters for the CAS before RAS refresh cycle. The CAS before RAS refresh cycle is the timing cycle in which the contents of DRAM chips of memory 18 are refreshed. The SRFRSH selector 36 includes a multiplexer 78 that determines the number of cycles by which the CAS signal precedes the RAS signal. If the SRFRSH bit is "1", the CAS signal precedes RAS setup by two cycles, and if the SRFRSH bit is "0", the CAS signal precedes RAS setup by three cycles. The selected number of cycles is output on line 54a to timing control unit 37 (FIG. 2).

The selector 36 also includes multiplexer 80. Multiplexer 80 selects the number of cycles for which the CAS signal precharges before a refresh cycle. If the SRFRSH bit is "1", the CAS signal precharges for three cycles, and if the SRFRSH bit is "0", the CAS signal precharges for four cycles. The selected timing parameter is output on line 54b to timing control unit 37.

Also included in the SRFRSH selector 36 is multiplexer 82 which determines how long the CAS signal is held after the assertion of the RAS signal. If SRFRSH has a value of "1", the CAS signal is held for three cycles, and if the SRFRSH bit has a value of "0", the CAS signal is held for four cycles. The selected timing parameter is output on line 54c to timing control unit 37.

Lastly, the SRFRSH selector 36 includes a multiplexer 84 that selects the active time of the RAS signal. If the SRFRSH bit has a value of "1", the RAS active time is five cycles, and if the SRFRSH bit has a value of "0", the RAS active time is seven cycles. The selected active time is output on line 54d to timing control unit 37 (FIG. 2).

Figure 3D:
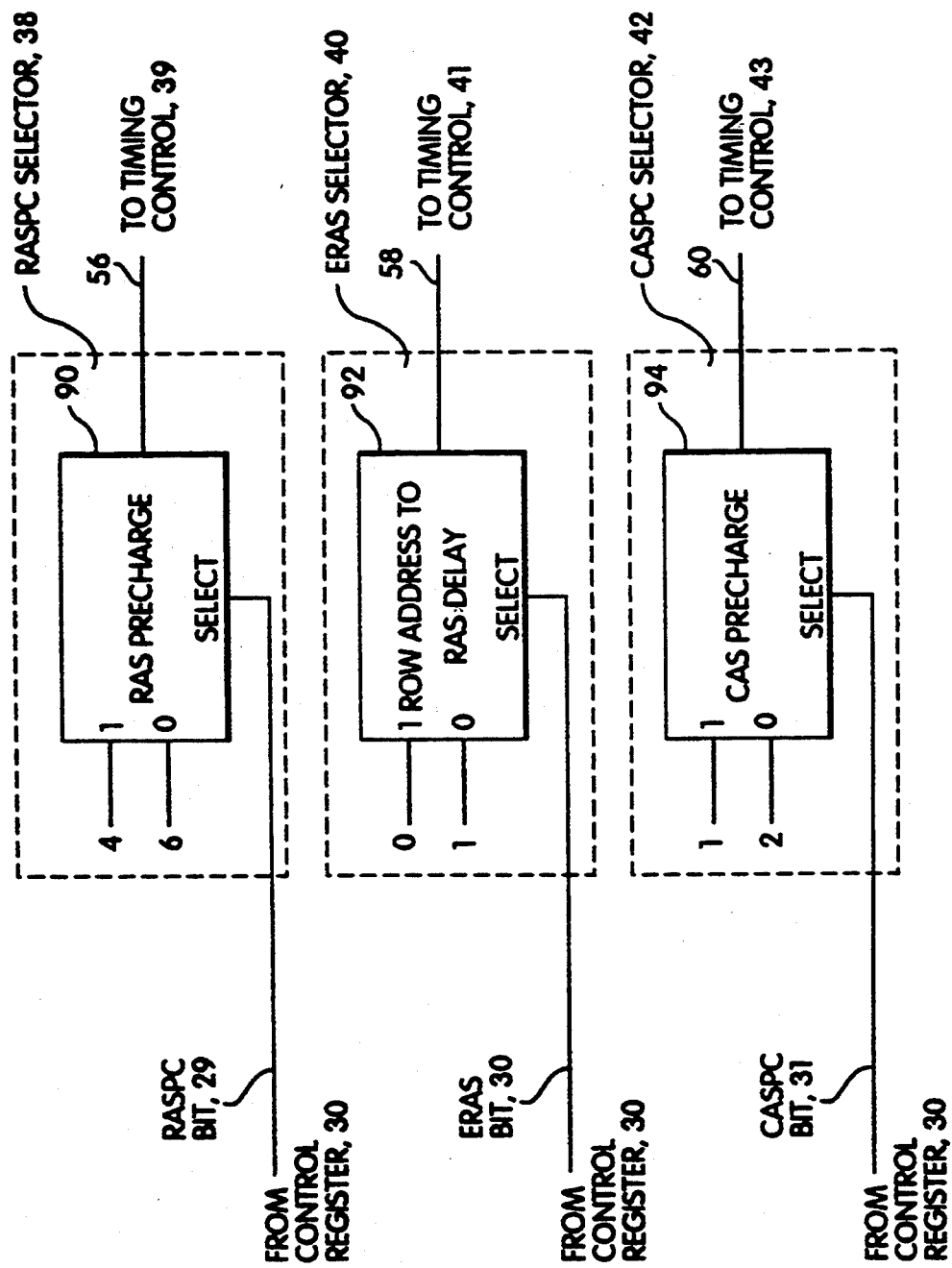
FIG. 3d is a more detailed block diagram of the RASPC selector 38, the ERAS selector 40, and the CASPC selector 42 of FIG. 2.

FIG. 3d shows the RASPC selector 38, the ERAS selector 40 and the CASPC selector 42 in more detail. The RASPC selector 38 comprises a multiplexer 90 that has the RASPC bit as its select input. Multiplexer 90 selects the length of the RAS signal precharge to be either four cycles (when the RASPC bit is "1") or six cycles (when the RASPC bit is "0"). The selected cycle length is output on line 56 to timing control unit 39 (FIG. 2).

ERAS selector 40 (FIG. 3d) includes a multiplexer 92 which determines the delay between the time when a row address is placed on the address line and the assertion of the RAS signal. The ERAS bit is the select input to multiplexer 92. The output is zero when the ERAS bit is "1", and the output is one when the ERAS bit is The selected output is sent over on line 58 (FIG. 3d) to timing control unit 41 (FIG. 2).

CASPC selector 42 (FIG. 3d) includes a multiplexer 94 that determines the length of the precharge for the CAS signal during a fast page mode access. The CASPC bit is the select input to multiplexer 94 (FIG. 3). The CAS precharge may have a length of either one cycle when the CASPC bit is "1" or zero cycles when the CASPC bit is "0". The selected precharge length is output on line 60 to timing control unit 43 (FIG. 2).

Figure 4:
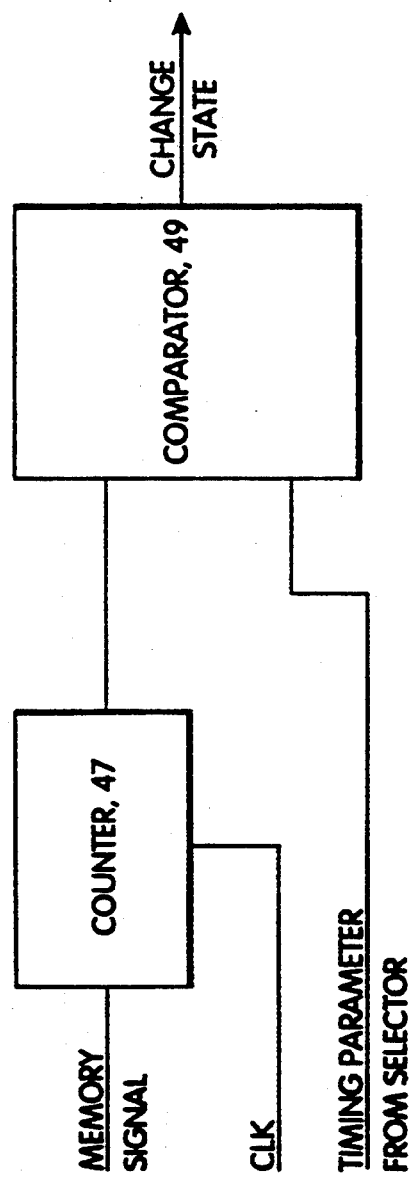
FIG. 4 is a block diagram of one of the timing control units of FIG. 2.

A block diagram of a representative timing control unit is shown in FIG. 4. The circuitry shown in FIG. 4 is repeated for each timing parameter with minor variations. A memory control signal from state machine 46 enables a counter 47. The counter 47 is incremented by the system clock and is configured to count the number of clock cycles during which the input memory signal is in a particular state (which can be "1" or "0"). For example, the memory signal can be the CAS signal and the counter 47 can determine the number of clock cycles that the CAS signal is in the active state. The output of counter 47 is a binary number that represents the number of clock cycles for which the input memory signal was in a particular state. The output of counter 47 is supplied to one input of a comparator 49. The timing parameter from the corresponding selector (FIGS. 3a to 3d) is supplied to the other input of comparator 49. In the example described above wherein the counter 47 determines the active time of the CAS signal, the output of selector 62 (FIG. 3a) is input to comparator 49. The timing parameter, as described above, determines whether the CAS signal has an active time of 2 cycles or 3 cycles. When the comparator 49 determines that the output of counter 47 is equal to the corresponding timing parameter, it provides a change state output signal to state machine 46. The state machine then terminates the CAS signal at either 2 cycles or 3 cycles as determined by the timing parameter.

The circuit shown in FIG. 4 is repeated for each of the timing parameters and the corresponding memory signal. In some cases, the timing parameter specifies the time duration of a selected signal. The selected signal is input to counter 47 and its duration is determined. When the desired time duration is reached, the selected signal is terminated by the state machine in response to the change state signal. In other cases, the timing parameter specifies the elapsed time between a predefined event in a first signal and a predefined event in a second signal. For example, the timing parameter can specify the delay between a first signal going active or inactive and a second signal going active or inactive. In this case, the first signal is input to counter 47 and the timing parameter from the corresponding selector is input to comparator 49. The comparator 49 provides a change state signal to state machine 46 to initiate or terminate the second signal.

Figure 5A:
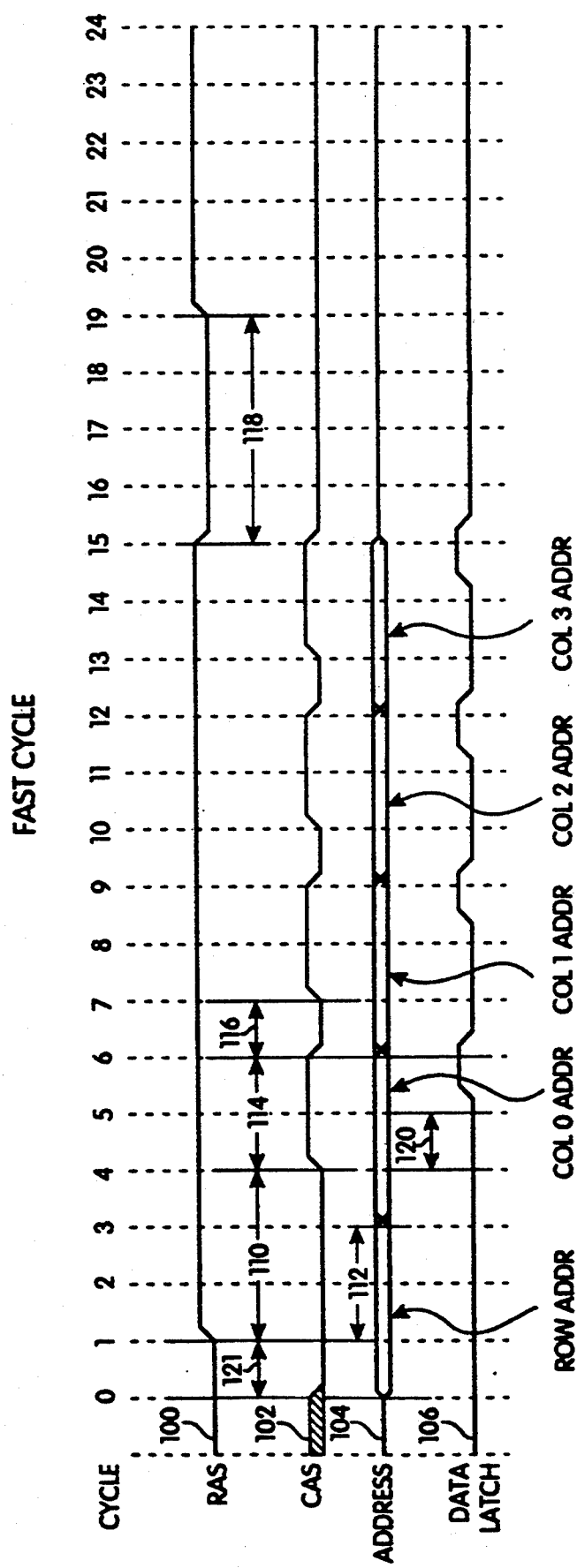
FIG. 5a is an example timing diagram of the RAS, CAS, address and data latch signals for an example using a fast mode of operation.

As discussed above, by setting the six timing control bits (bits 26–31) in the control register 30 (FIG. 2), a manufacturer or system designer may tailor the memory timing for a particular system. For example, assume that the manufacturer of a system required the memory controller 16 to operate so that it performs reads on a page basis in a fast mode of operation. FIG. 5a shows the timing of the RAS signal 100, the CAS signal 102, the address signal 104 and the data latch signal 106 for this example. In order to establish this timing, the manufacturer sets the SCAS bit (bit 26), the ECAS bit (bit 27), the RASPC bit (bit 29), the ERAS bit (bit 30) and the CASPC bit (bit 31) in control register 30 (FIG. 1) to each have a value of "1".

To understand how the setting of the control bits implements the timing shown in FIG. 5a, reference is made to the selectors 32, 34, 36, 38, 40 and 42 shown in FIGS. 3a–3d. As shown in FIG. 3a, the SCAS bit 26 is the select input to multiplexers 62, 64, 66 and 68 in SCAS selector 32. Since the SCAS bit is "1", the first inputs (labeled "1") of each of the multiplexers 62, 64, 66 and 68 are selected. Hence, multiplexer 62 selects the CAS signal to be active for two cycles. In FIG. 5a, an example of the active time period of the CAS signal 102 is shown as period 114.

Since the SCAS bit is "1", multiplexer 64 selects the column address to be held for one cycle after the assertion of the CAS signal (see the time period 114 in FIG. 5a).

The "1" value for the SCAS bit is also input to multiplexers 66 and 68 (FIG. 3a). In multiplexer 66, the time separating the assertion of the CAS signal and the read data latch is set to one cycle. In FIG. 5a, period 120 indicates the separation between the assertion of the CAS signal 102 at the beginning of cycle 4 and assertion of the data latch signal 106 at the beginning of cycle 5. The separation between these events is one cycle. The output of multiplexer 68 is not used during the read operation, but is used during a write operation. Therefore, the operation of multiplexer 68 is not discussed for the example of FIG. 5a.

The setting of the ECAS bit to "1" selects the control parameters shown in FIG. 3b for multiplexers 70, 72, 74 and 76. The "1" value of ECAS bit is fed to multiplexer 70, where a delay of three cycles between the assertion of the RAS signal and assertion of the CAS signal is selected. In FIG. 5a, the delay between the assertion of RAS signal 100 at the beginning of cycle 1 and the assertion of the CAS signal 102 at the beginning of cycle 4 is illustrated by time period 110.

The ECAS bit is also input to multiplexer 72 to select the time which separates the assertion of the RAS signal and the switching from a row address to a column address. A time period of two cycles is selected. In FIG. 5a, the RAS signal 100 is first asserted during cycle 1, and the switching of the address from a row address to a column address occurs at the beginning of cycle 3. Hence, the time period 112 in FIG. 5a is two cycles.

The effect of the ECAS bit 27 and multiplexers 74 and 76 is not pertinent to the example of FIG. 5a. Thus, the effect of this selection is not discussed herein. The effect of the SRFRSH bit on multiplexers 78, 80, 82 and 84 (FIG. 3c) is also not pertinent and is not discussed for this example.

In the example shown in FIG. 5a, the RASPC bit, the ERAS bit and the CASPC bit all have a value of "1". As shown in FIG. 3d, the "1" value for the RASPC bit is input to multiplexer 90, which selects the precharge time for the RAS signal to be four cycles in length. Accordingly, time period 118 in the RAS signal 100 is four cycles. Similarly, the ERAS bit selects no additional delay to be added to the one cycle delay separating when a row address is applied to the address line and when the RAS signal is first asserted (see time period 121 in FIG. 5a). The multiplexer 92 selects an output of zero, which indicates that there will be the typical one cycle delay. If an output of one is selected, the delay is increased by a cycle to two cycles.

Lastly, the "1" value for the CASPC bit is input to multiplexer 94 (FIG. 3d) to select the CAS signal precharge time to be one cycle in length. In FIG. 5a, time period 116 corresponds to the CAS signal 102 precharge time.

Figure 5B:
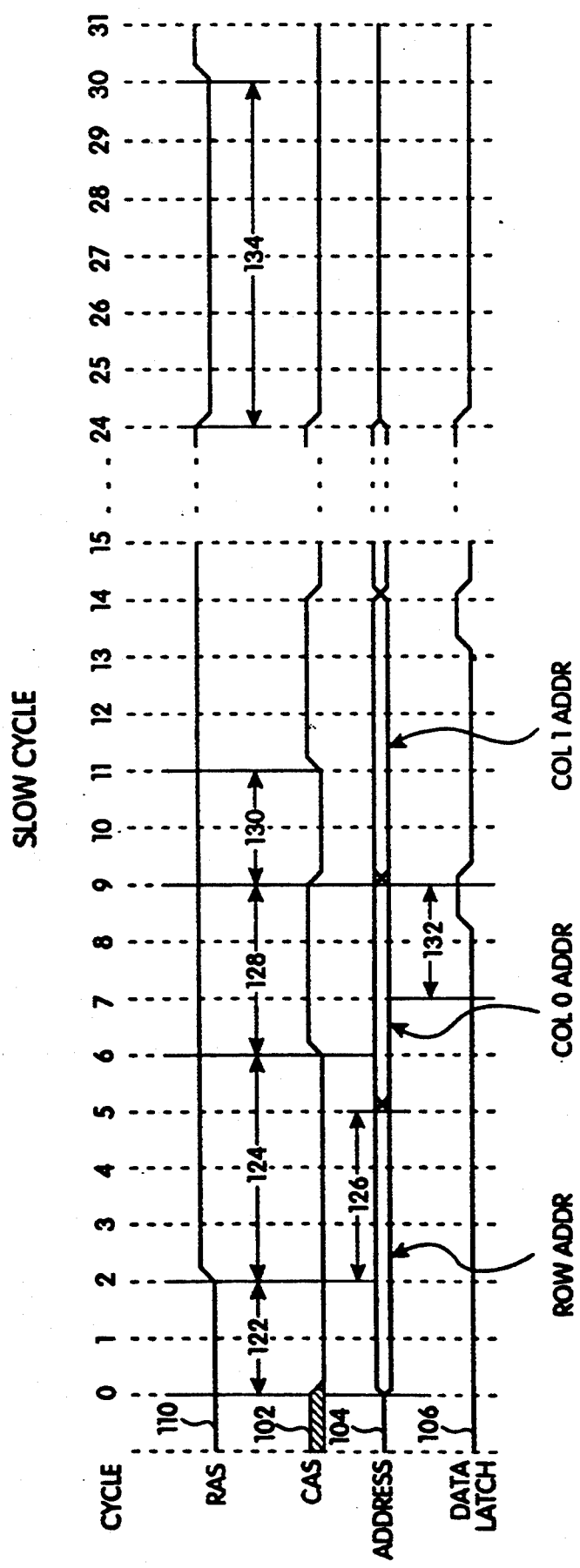
FIG. 5b is an example timing diagram of the RAS, CAS, address and data latch signals in a slow mode of operation.

FIG. 5b illustrates an example of RAS signal 100, CAS signal 102, address signal 104 and data latch signal 106 in a page read for a slow mode of operation. In this instance, the SCAS bit, the ECAS bit, the RASPC bit, the ERAS bit, and the CASPC bit are all set to "0". Therefore, multiplexers 62, 64, 66 (FIG. 3), 70, 72 (FIG. 3b), 90, 92 and 94 (FIG. 3d) all select values that differ from those selected in the example of FIG. 5a.

Given that the SCAS bit is "0", the active time of the CAS signal is three cycles (see multiplexer 62 in FIG. 3a). Time period 128 in FIG. 5b corresponds to the active time of the CAS signal 102. The "0" value for the SCAS bit also specifies that the column address is held for two cycles after the assertion of the CAS signal (see multiplexer 64 in FIG. 3a). Time period 132 in FIG. 5b indicates that the hold time of the column address is two cycles. In addition, the SCAS bit value of "0" specifies the time between the initial assertion of the CAS signal and the assertion of the read data latch as two cycles (see multiplexer 66 in FIG. 3a). Time period 132 corresponds to the time between the initial assertion of the CAS signal 102 and the assertion of the read data latch signal 106.

Since the ECAS bit has a value of "0", the delay between the initial assertion of the RAS signal and the initial assertion of the CAS signal is four cycles in length (see multiplexer 70 in FIG. 3b). In FIG. 5b, the delay between the RAS signal 100 and the CAS signal 102 is denoted by time period 124. Also, the time between the initial assertion of the RAS signal and the switching from a row address to a column address is three cycles (see multiplexer 72 in FIG. 3b). Time period 126 in FIG. 5b indicates the time between the assertion of the RAS signal 100 and the time when the address signal 104 is switched from a row address to a column address.

Since the RASPC bit is set to have a value of "0" in the example of FIG. 5b, the length of the precharge for the RAS signal is six cycles (see multiplexer 90 in FIG. 3d). Time period 134 in FIG. 5b represents the precharge period of RAS signal 100. Furthermore, since the ERAS bit has a value of "0", there is an additional cycle of delay (time period 122) between the time when the row address is applied to the address line and the initial assertion of the RAS signal (see multiplexer 92 in FIG. 3d). Thus, in FIG. 5b, the row address is initially placed on the address line during the cycle zero, and the RAS signal 100 is first asserted during cycle 2. Lastly, since the CASPC bit has a value of "0", the CAS signal has a precharge period of two cycles (see multiplexer 94 in FIG. 3d). The precharge period on the CAS signal 102 is shown in FIG. 5b as time period 130.

These examples illustrate that by setting the bits 26–31 of the control register 30 (FIG. 2), a manufacturer or system designer may adjust the timing to match the requirements of the memory with which the memory controller 16 (FIG. 1) is used. The two examples of FIG. 5a and 5b are not intended to be exhaustive, but rather are intended to be merely illustrative. Those skilled in the art will recognize that many other combinations that may be utilized.

The programmable memory controller shown and described above has two selectable values for each timing parameter. It will be understood by those skilled in the art that more than two selectable timing parameter values can be utilized. In this case, the selectors have more than two inputs and more a single control bit. Furthermore, the timing control units illustrated in FIG. 4 can utilize a variety of circuits for converting the timing parameters to timing control signals.

In a preferred embodiment, the memory controller shown and described herein is implemented in a large scale integrated circuit using automated design techniques. Equations describing the desired circuit functions are input to a computer program which implements the functions according to predefined design rules. Thus, the actual circuit implementation may differ from that shown and described herein.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A memory controller for controlling access to a memory, comprising:
    means for generating memory signals including address and control signals for accessing said memory in response to a physical address, each of said memory signals having at least one timing characteristic; and
    means for programming the timing characteristic of at least one of said memory signals, said means for programming comprising a control register for storing at least one timing control bit and at least one selector responsive to said timing control bit for selecting a timing parameter from a plurality of predetermined timing parameters, and means responsive to the selected timing parameter and to a selected memory signal for generating a timing control signal, said timing control signal controlling the timing characteristic of said one of said memory signals.

2. A memory controller as defined in claim 1 wherein said means for generating a timing control signal comprises means for determining an elapsed time after a predefined event in said selected memory signal and means for generating said timing control signal when the elapsed time after said predefined event in said selected memory signal is equal to a value specified by said selected timing parameter.

3. A memory controller as defined in claim 1 wherein said address and control signals include a row address strobe, a column address strobe and address signals.

4. A memory controller as defined in claim 1 wherein said timing parameter specifies a predetermined number of clock cycles.

5. A memory controller as defined in claim 1 wherein said means for generating a timing control signal comprises means for determining a duration of said selected memory and means for generating said timing control signal when the duration of said selected memory signal is equal to a value specified by said selected timing parameter.

6. A memory controller as defined in claim 1 wherein one of said memory signals comprises a column address strobe signal, wherein said timing characteristic comprises an active time of said column address strobe signal and wherein said means for programming establishes the active time of said column address strobe signal.

7. A method for controlling access to a memory comprising the steps of:
    generating memory signals including address and control signals for accessing said memory in response to a physical address, each of said memory signal having at least one timing characteristic; and
    programming the timing characteristic of at least one of said memory signals, comprising the steps of storing at least one timing control bit in a control register, selecting a timing parameter from a plurality of predetermined timing parameters in response to said timing control bit, and generating a timing control signal in response to the selected timing parameter and to selected memory signal, the timing control signal controlling the timing characteristic of said one of said memory signals.

* * * * *